(12) United States Patent
Hansen et al.

(10) Patent No.: US 7,046,572 B2
(45) Date of Patent: May 16, 2006

(54) LOW POWER MANAGER FOR STANDBY OPERATION OF MEMORY SYSTEM

(75) Inventors: David R. Hansen, Brewster, NY (US); Gregory J. Fredeman, Staatsburg, NY (US); John W. Golz, Garrison, NY (US); Hoki Kim, Hopewell Junction, NY (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 10/250,233

(22) Filed: Jun. 16, 2003

(65) Prior Publication Data

US 2004/0252573 A1 Dec. 16, 2004

(51) Int. Cl.
*G11C 7/00* (2006.01)
(52) U.S. Cl. ...................... 365/229; 365/226
(58) Field of Classification Search .............. 365/229, 365/189.09, 189.11, 226, 230.06
See application file for complete search history.

(56) References Cited

U.S. PATENT DOCUMENTS

| 4,120,047 | A | | 10/1978 | Varadi |
|---|---|---|---|---|
| 5,313,430 | A | * | 5/1994 | Rawlins et al. |
| 5,877,616 | A | * | 3/1999 | Wan et al. |
| 6,115,308 | A | | 9/2000 | Hanson et al. |
| 6,141,240 | A | * | 10/2000 | Madan et al. |
| 6,236,617 | B1 | | 5/2001 | Hsu et al. |
| 6,426,914 | B1 | | 7/2002 | Dennard et al. |
| 6,580,649 | B1 | * | 6/2003 | Park |

* cited by examiner

*Primary Examiner*—Richard Elms
*Assistant Examiner*—Hien Nguyen
(74) *Attorney, Agent, or Firm*—Graham S. Jones; H. Daniel Schnurmann

(57) ABSTRACT

A memory system includes a memory array, a plurality of wordline drivers, a row address decoder block which has a plurality of outputs connected to selected ones of the wordline drivers, a row selector block which has a selector lines connected to individual ones of the wordline drivers. A power management circuit having a power down input for a power down input signal (WLPWRDN) and a wordline power down output (WLPDN) is connected to the wordline drivers to lower the power consumption thereof as a function of the power down input signal.

9 Claims, 6 Drawing Sheets

LOW POWER MANAGER FOR STANDBY OPERATION OF MEMORY SYSTEM

BACKGROUND OF INVENTION

There is a constant motivation to reduce the active power and/or standby power of semiconductor chips and macros. This current focus is dictated by the increased proliferation of semiconductors in mobile and portable applications. Therefore, a need exists for intelligent power management on memory chips and macros.

In the past power management of memory refresh operations has been described in U.S. Pat. No. 4,120,047 of Varadi entitled "Quasi-Static MOS Memory Array With Standby Operation. The Varadi patent describes a MOSFET " memory array that uses a single voltage source (i.e., 5 volts) and operates basically as a static memory array rather than as a dynamic memory array that requires the gates of the MOS devices of the memory array to be periodically refreshed to restore or refresh the memory states contained therein. Each of the memory cells of the memory array contains four MOS devices that are cross-coupled into a flip-flop type of memory cell. All of the memory cells connected to a common word line are also connected to a common return line to which is connected a single resistor and a single large MOS or FET device. The large MOS device is turned on during the active operation of the memory array (during write and read operations) and is turned off during the standby operation of the memory array. The resistor functions to insure that some current flow takes place, during the standby operation, from all the memory cells connected to the common return line in order to maintain the data states ("1" or "0") in each of the memory cells." In the intervening years since the issuance of the Varadi patent we have found that there remains a need for a method and device for providing low power standby operation that occupies less silicon area and is applicable to word-line driver architectures as well.

U.S. Pat. No. 6,236,617 of Hsu et al. entitled "High Performance CMOS Wordline Driver" describes a wordline DRAM array having n groups of m wordlines, in which one group is driven by a group decoder circuit (having a voltage swing between ground and a circuit high voltage and one driver circuit in each group is exposed to a boosted wordline high voltage greater than the circuit high voltage), in which the wordline driver circuits have an output stage comprising a standard NFET in series with a high threshold voltage PFET. In the example shown there are 1024 wordline drivers and a row (group) decoder "100" which drives the gates of a selected group of four of those wordline drivers. A wordline selector "200" provides an input to the source of a PFET transistor connected in series to a parallel pair of NFET transistors, one of which has its gate connected to the row (group) decoder and the other one of which has its gate connected to a restore circuit. The driver passes voltage Vpp on to a wordline, since WLDV connected to that driver is at Vpp. However, for the remaining (m−1) drivers in that group, the WLDV signals are kept at the Vm (e.g. 0.7V) level and even though the gates of those drivers are pulled low, the high Vt (about −1.2V) of the PFET device, will not prevent the output of those drivers from being maintained by the restore circuit at a negative level (or −0.5V.) The restore circuit opens a path between a terminal and the wordline to restore the quiescent state on the wordline block.

U.S. Pat. No. 6,426,914 of Dennard et al. entitled "Floating Wordline Using A Dynamic Row Decoder And Bitline VDD Precharge" describes a "wordline driver D consisting of a pull-up pMOS PU, a pull-down MOS PD, and a second nMOS pull-down device K which is called a killer device. This killer device is used to deselect the half-selected wordlines so they will not be floating." Dennard et al states further that "each decoded output from a level shifter is tied to a group of four wordline drivers. One of the four wordline drivers is selected by decoding the sources of the pull-up pMOS devices as well as the gates of the killer devices."

FIGS. 1A and 1B describe a prior art DRAM memory configuration with the problem or achieve an of excessive consumption of power during standby operation.

FIG. 1A shows a prior art memory configuration for multi-banked a DRAM 10. The DRAM 8 includes a set of Second Sense Amplifiers (SSA) 11 and sixteen (16) banks 120, 121, 12X, 133, 134, and 135.

Referring to Second Sense Amplifiers (SSA) 11, Hanson et al. U.S. Pat. No. 6,115,308 entitled "Sense Amplifier and Method of Using the Same with Pipelined Read, Restore and Write Operations" describes a second sense amplifier memory device which may have a sense amplifier circuit and two drivers connected to the sense amplifier circuit. Two data bus lines may be connected to the sense amplifier circuit to receive data signals. A first equalize signal and a second equalize signal are applied to the sense amplifier circuit to allow the sense amplifier circuit to receive the data signals across the data bus lines. A switch signal is applied to the sense amplifier circuit to connect the data bus lines to a read data bus. The state of the first equalize signal is changed so that the data bus lines either receive new data or the data bus lines are equalized to a predetermined voltage while the data is on the read data bus and is capable of being read.

As additional background for this invention, the row architecture of one of the banks 12X of a DRAM 10, which is shown some in detail in FIG. 1B, is described next. The row path is comprised of three key blocks; the RDEC (Row address DECoder) block 14, the RSEL (Row SELectorlevel shifter as in Dennard et al.) block 16, and the row or WLDRV (WordLine DRiVer) block 18 in which there are 128, i.e. (X+1), wordline blocks WLDRV, e.g. wordline blocks DR1 to DR512 for control codes WLDRV<0>, WLDRV<1>, WLDRV<2>, WLDRV<3>,z,900 WLDRV<X> where X=511. In response to control codes from a data processing system (not shown), the RDEC block 14 and the RSEL block 16 perform a process of hierarchical decoding. First, the RDEC block 14 enables the selection of four (4) wordlines out of the total number of 512 wordlines WLDRV<0>, WLDRV<1>, WLDRV<2>, WLDRV<3>>,z, 900 WLDRV<127>. For the example of 512 rows in a bank, the RDEC performs a 1/128 decode. Then the RSEL block 16 performs the final ¼ decode with a two-bit predecoder (not shown) to activate one (1) of the four WLDRV blocks activated by the RDEC block 14 with a signal on one of the WLDV lines 20A–20D. For example referring to FIG. 2 the RSEL in FIG. 1B can employ the two-bit predecoder (not shown) to activate line 20A, which is one of the four wordline drivers 20A–20D. Thus, the row selector RSEL block 16 has a selector line 20A–20D connected to n/$2^x$ of the wordline drivers in the group of n wordline drivers, where x= is an integer greater than 1, e.g the selector line is connected to n/4 or n/8 of the wordline drivers. The signal on the WLDECN bus line performs the ¹⁄₁₂₈ decode, enabling four WLDRVs with horizontal buses. In summary, the RDEC block 14 sends a signal on lines WLDEC-1 to WLDEC-128 to select four WLDRV units. For example, as shown by FIG. 1B, line WLDEC-1 line 15-1 is connected so that it can simultaneously energize four wordline drivers WLDRV<0:3>, i.e. WLDRV<0>, WLDRV<1>, WLDRV<2>, WLDRV<3>) from the set of the 512 wordlines with the signal on the WLDECN (WordLine DECoder Signal @ low) line to perform a ½32 decode. The WLDECN-128 line 15-128 can energize the last four wordline drivers WLDRV<508> driver (not shown), WLDRV<509> driver (not shown), WLDRV<510> driver (not shown), and WLDRV<511> driver DR512 which is the only one of the four shown in FIG. 1B for convenience of illustration.

Then the RSEL block 16 decodes a one (1) out of the four (4) signals from the data processing system (not shown) to select one of the four wordlines enabled by the RDEC block 14. The RSEL block 16 then encodes signals on vertical Word Line DriVe (WLDV) lines 20A–20D to enable ¼ of the Word Line DriVe (WLDRV) blocks with signals on WLDV lines 20A–20D. The output of the RSEL block, ¼ of the WLDV bus lines 20A–20D will be active while at the same time ¾ of the Word Line ReSeT (WLRST) bus lines 22A–22D will be activated to ensure the deactivation of the remaining ¾ of the wordline blocks WLDRV. In the current state of the art of multi-banked DRAMs and embedded DRAMs, the process of wordline decoding is performed hierarchically.

The non-activated wordlines are held low by three (3) out of four (4) of the Wordline Reset signals (WLRST<0:3>) on wordline bus lines 22A–22D. For example, if WLDRV<0> is to be selected, the value on line 20A for the code WLDV<0> will be high. In addition the value on bus lines 22A–22D for the three codes WLRST<1:3> will be high, the three codes WLDV<1:3> will be low, and for the single code WLRST<0> line 22A will be high.

FIG. 2 shows a portion 18″ of the WLDRV block 18 of FIG. 1B which includes two of the prior art wordline driver circuits DR1 and DR2 plus BL<0> bitline 28, and two array transistor circuits A0/A1 with two related array capacitors C1/C2.

Block DR1 includes pull-up PFET transistor P1, pull-down NFET transistor N1 and killer NFET transistor N2. For the pull-up PFET P1 the source is connected to WLDV<0> line 20A and the drain is connected to node B2, as are the drains of the pull-down NFET N1 and the killer NFET N2. The gates of transistors P1 and N1 are connected via node B1 to WLDECN line 15-1. The gate of NFET N2 is connected to WLRST<0> line 22A. The sources of the Dull-down and killer transistors N1 and N2 are connected to ground (reference potential). The drains of transistors Pi, N1 and N2 are all connected via node B2 to the wordline output WL<0> line 26-1 which connects to the gate of NFET array transistor A0 which has its source connected to the array capacitor C1 (connected to ground) and its drain connected to node B5, which is the BL<0> line 28.

Block DR2 includes pull-up PFET transistor P2 and pull-down NFET transistor N3 and killer NFET transistor N4. For PFET P2 the source is connected to WLDV<1> line 20B and the drain is connected to node B4, as are the drains of transistors N3 and N4. As in block DR1, the gates of transistors P2 and N3 are connected via node B3 to WLDECN line 15-1. The gate of transistor N4 is connected to WLRST<1> line 22B. The sources of transistors N3 and N4 are connected to ground (reference potential). The drains of transistors P2, N3 and N4 are connected via node B4 to the wordline output WL<1> line 26-2 which connects to the gate of NFET array transistor A1 which has its source connected to the array capacitor C2 (connected to ground) and its drain (like the drain of NFET array transistor A0) is also connected to node B5, which is the BL<0> line 28. Examples of voltages applied to the circuit are VDD which has a value of about 1.2, Vpp which varies between a value of 0V and about 1.5V to 2.5V and WLRST which varies between about 0V and VDD, i.e. 1.2V. The value of WLDV<0> is shown to be VPP (e.g. 2.5V) after rising from 0V. The value of WLDV<1> is shown to be 0V after falling from VPP (e.g. 2.5V).

As stated above with respect to FIG. 1B, in the RSEL 16 a two-predecoder (not shown is used to activate line 20A which is one of the four wordline drivers 20A–20D. Then referring to FIG. 2, in order to activate WL<0> line 26-1, the source of the pMOS pull device P1 is tied to VPP, while the gate of the killer device is tied to Ground on line 22A. At this moment, the sources of the other three pMOS pull devices in drivers DR1, DR2, DR3 and DR4 stay at ground, and the gates of the other three killer devices stay at VDD. This second level decoding is applied to all the wordline drivers in the first level decoded group of four.

Referring to FIG. 2 and the above example, the signal on the shared WLDECN line 15-1 from the RDEC block 14 in FIG 1B is low, preventing NFET transistors N1 in driver DR1 WLDRV<0> and N3 in WLDRV<1> in driver DR2 from conducting. The input for code WLDV<1> on line 20B to the source circuit of PFET P2 in driver DR2 will be lows and for the gate terminal of NFET N4 single code WLRST<1> in driver DR2 the value will be high, preventing the PFET P2 from conducting and enabling the NFET N4 in driver DR2 to conduct, respectively. The input WLDV<0> on the source terminal of the PFET P1 is high enabling the PFET P1 to conduct and to charge the WL<0> wordline 26-1, up to VPP, its boosted logic level '1'. The reset value on bus 22B for code WLRST<1> would be high on the gate of the NFET N4, thereby enabling the NFET N4 to conduct and to discharge the wordline 26-2, WL<1> up to ground, which is its logic level '0'. The activated WL<0> wordline 26-1 drives the gate of the array transistor PFET A1 to read data from or to write data into the memory element.

When the memory array is placed in a standby state, none of the wordlines are activated. Therefore, in that case, all of the array transistor gates will be at the logic level "0" or ground.

SUMMARY OF INVENTION

In accordance with this invention, a memory system is provided which includes a memory array with a plurality of wordline drivers included in a group of wordline drivers with n wordline drivers in a group. A row address decoder block has an output connected to each of the wordline drivers in the group of wordline drivers. A row selector block has a selector line connected to $n/2^x$ of said wordline drivers in the group of n wordline drivers, where x=is an integer greater than 1. A power management circuit having a power down input for a power down input signal (WLP-WRDN) and a wordline power down output (WLPDN) are connected to the wordline drivers to lower power consumption of the memory system as a function of the power down input signal.

Preferably, the power management circuit includes a plurality of FET devices, an inverter and a negative bias voltage one of the FET devices connecting a reference potential to the WLPDN output in the absence of a WLP-WRDN signals and with another FET connecting a negative voltage WLNEG to the WLPDN output in the presence of a WLPWRDN signal.

Preferably, the standby power management circuit includes an input terminal and an output terminal. The output terminal is connected to vary bias to the driver circuits in the wordline driver to vary operation thereof between full power current operation and reduced standby current operation.

Preferably, the power management circuit includes a plurality of FET devices, an inverter and a negative bias voltage. One of the FET devices connects a reference potential to the WLPDN output in the absence of a WLP-WRDN signal and another FET connects a negative voltage WLNEG to the WLPDN output in the presence of a WLP-WRDN signal.

In accordance with another aspect of this invention, a standby power management circuit includes an input terminal and an output terminal. Switching means are provided including MOSFET devices for switching between a positive output and a negative output signal at the output terminal as a function of an input on the input terminal. The switching means include at least one inverter and NMOS and PMOS devices.

Preferably, the input terminal is connected through an inverter to the gate of a pull-up transistor. The output terminal is connected in series with a pass through transistor. A pull down FET transistor having a source/drain circuit is connected in series with a source of negative potential coupled to the output, and control FET transistors are connected to switch the gate of the pull down FET transistor as a function of a power down signal applied to the input.

The present invention uses a logic device for the array transistor to boost the array performance. The problem resolved by using this device is that the cost of the additional performance is that the standby power of the device is 1000x (pA) that of the DRAM-based array transistor (fA). Therefore, a need exists for a means to manage the standby power of the logic-array device and the memory array constructed with those devices.

Figure 2:
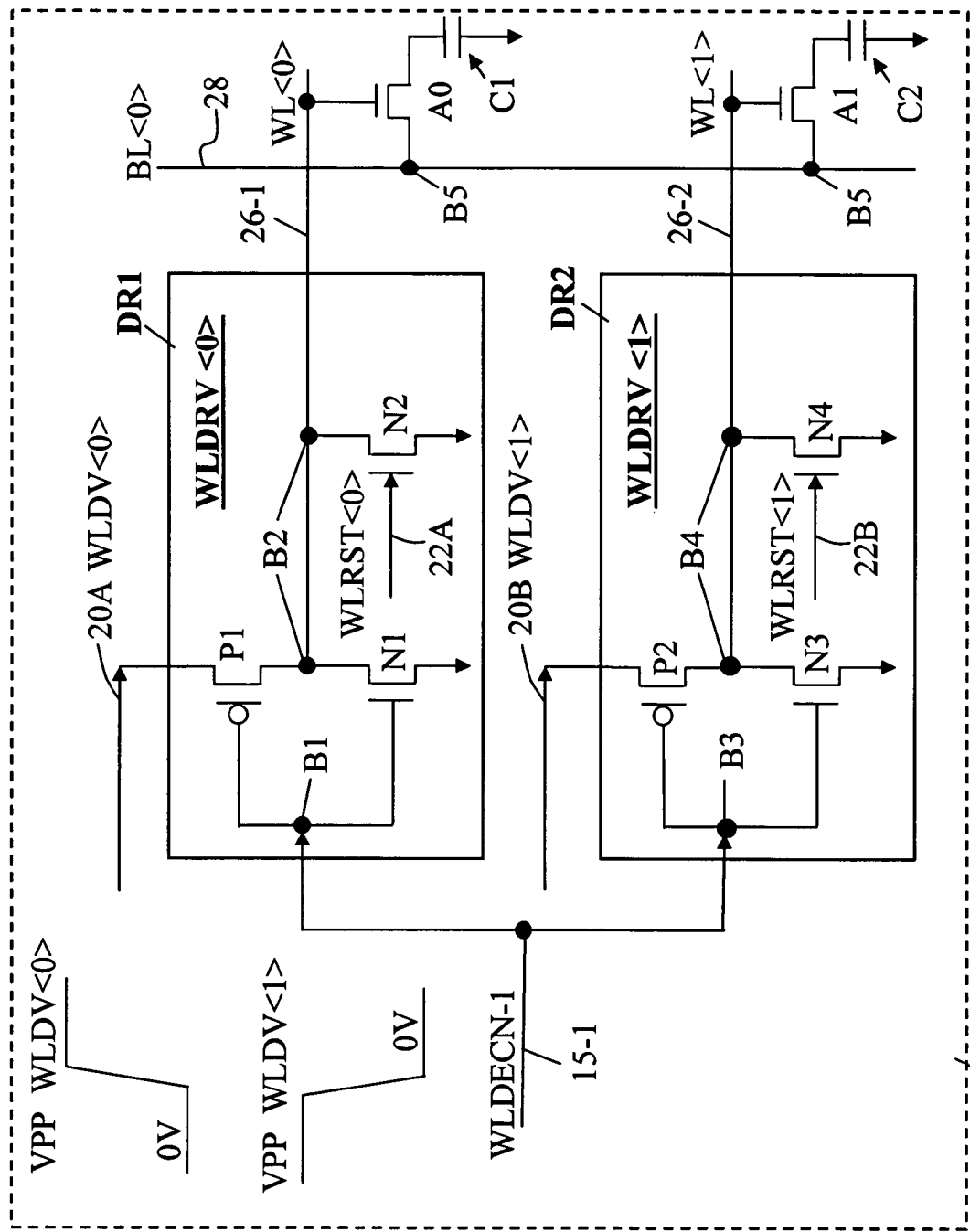
FIG. 2 shows a portion of the prior art WLDRV block of FIG. 1B which includes two of the prior art wordline driver circuits plus a BL<0> bitline, and array transistors with related array capacitors.

Referring to FIGS. 3–6, the present invention provides a means for managing the standby power of the type of the logic-array device shown in FIG. 2. A standby power manager is provided that will modulate the bias of the array device depending on whether the memory array needs to be operated in the two alternative operating modes including the high-performance mode and the low-power mode.

Figure 3:
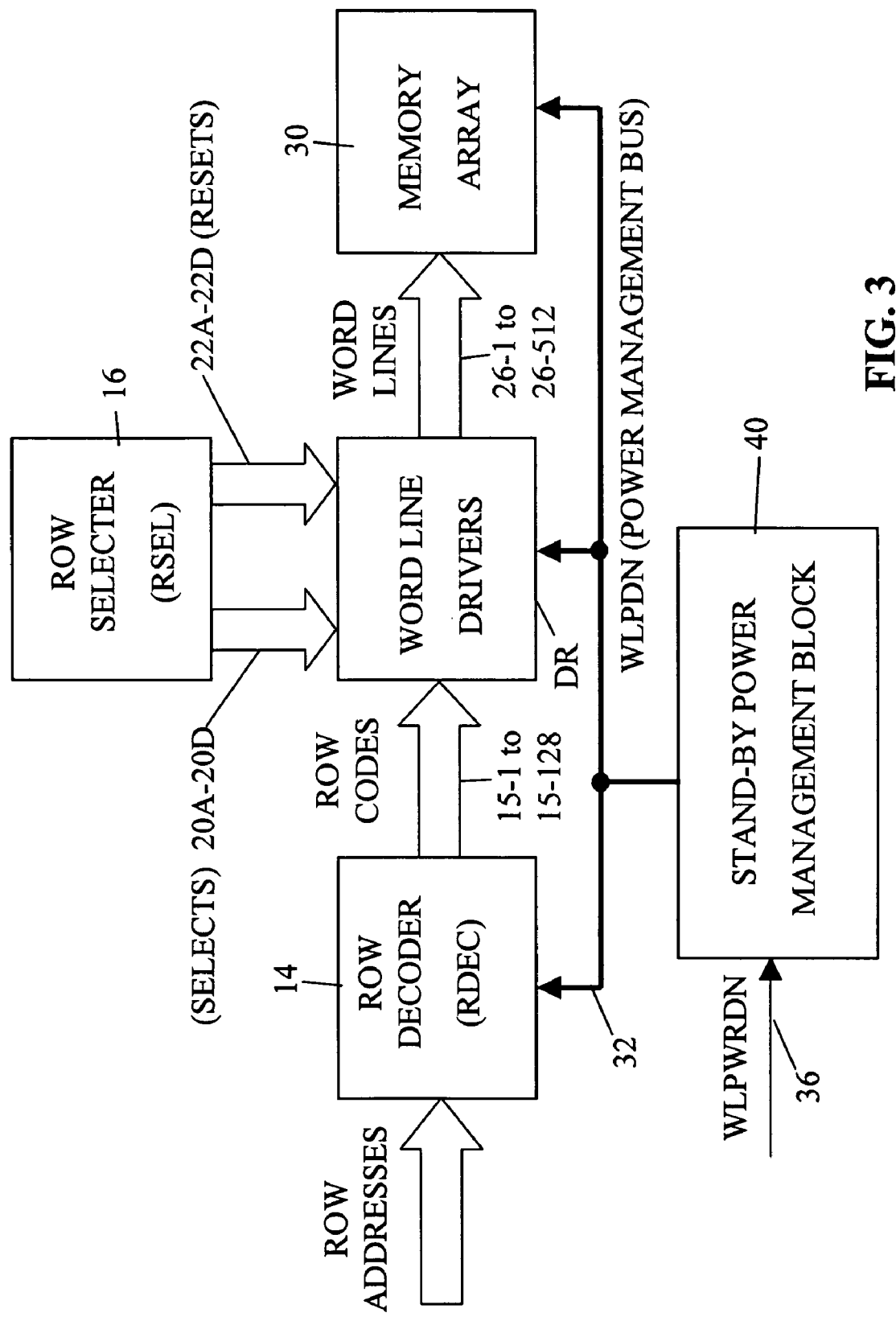
FIG. 3 illustrates a modified row architecture in accordance with this invention, which provides a means for providing the two alternative operating modes including a high-performance mode and a low-power mode.

FIG. 3 illustrates a modified row architecture in accordance with this invention, which provides a means for providing two operating modes including a high-performance mode and a low-power mode. For a memory array 30, the architecture is comprised of four other blocks; the row address decoder (RDEC) block 14, the row selector (RSEL) block 16, the wordline drivers block DR, and the standby power management block 40. The Standby Power Management (SPM) block 40 generates a WLPDN output on a power management bus line 32 which modulates the bias point of the array transistors and the logic level "0" of the outputs of the row decoder (RDEC) 14 and wordline driver blocks DR. In normal operation (high performance mode) the logic level "0" of the outputs 15-1 to 15-128 of the row decoder (RDEC 14 and wordline driver blocks DR lines 26-1 to 26-512 is ground. This maintains a bias upon the array the transistor that yields the highest performance. In standby operation (low power mode) the logic level "0" of the outputs of the row decoder 14 and wordline driver blocks DR is a voltage that is negative with respect to ground. Depending upon the technology this voltage can range from 0.2V to 1.5V. This bias condition reduces the array standby current by three orders of magnitude (from Pico-amps to femto-amps). As stated above, the row selector (RSEL) block 16 has a selector line 20A–20D connected to n/$2^x$ of the wordline drivers in a group of n wordline drivers, where x=is an integer greater than 1, e.g. the row selector RSEL 16 is connected to n/4 or n/8 of the wordline drivers DR.

Figure 1B:
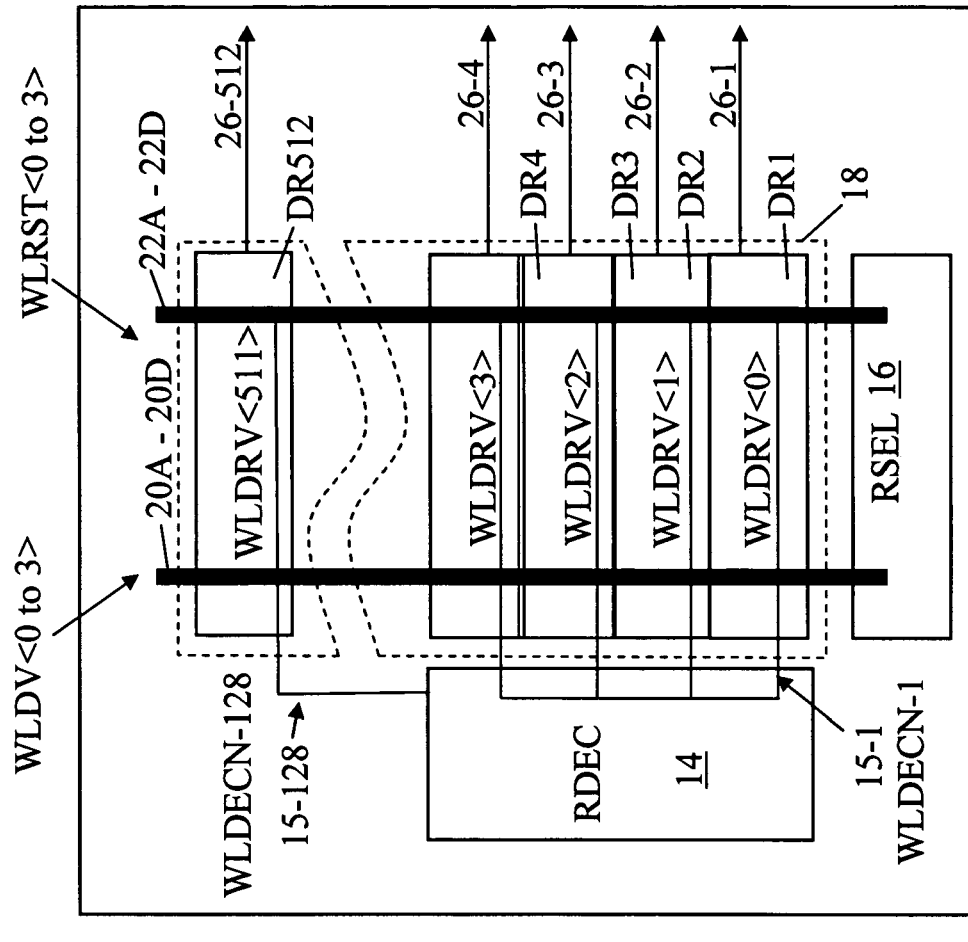
FIGS. 1A and 1B show a prior art DRAM memory configuration with the problem of excessive consumption of power during standby operation.
Figure 1A:
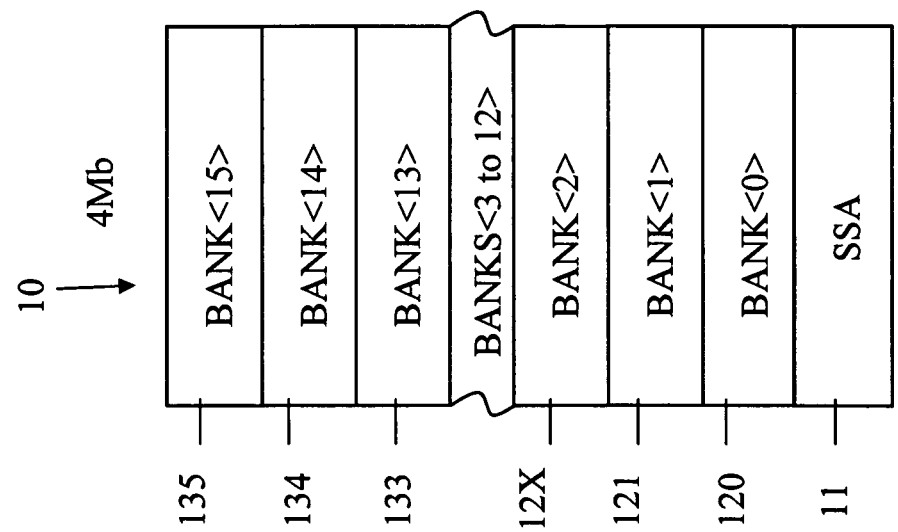
Figure 4:
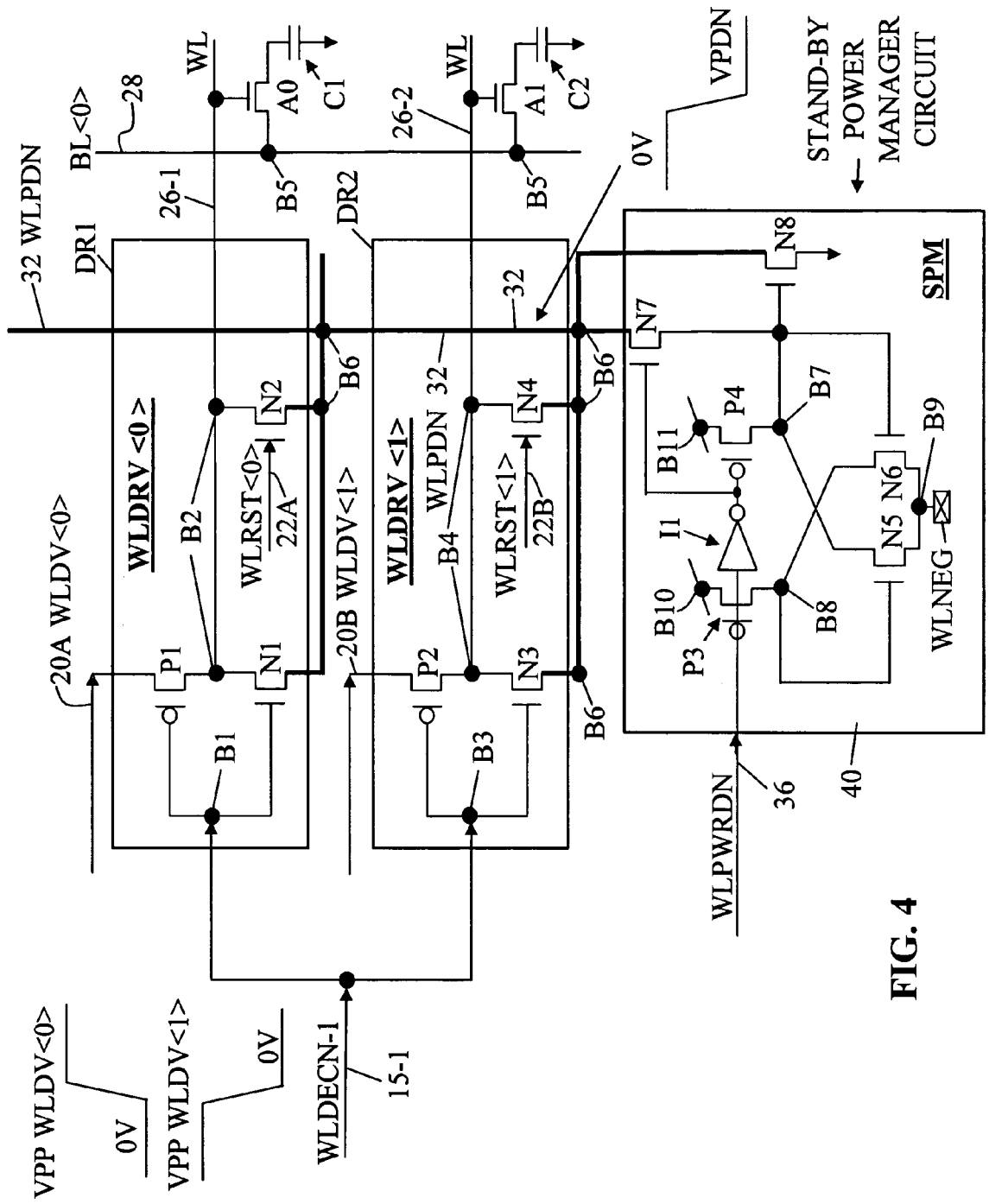
FIG. 4 shows a modification of the circuit diagram of FIG. 2 in accordance with this invention which demonstrates incorporation of an embodiment of the Standby Power Management (SPM) block of FIG. 3.

FIG. 4 shows a modification of the circuit diagram of FIG. 2, which demonstrates incorporation therein of an embodiment of the Standby Power Management (SPM) block 40 of FIG. 3. In FIG. 4, the SPM block 40 is interfaced with two (2) wordline driver circuits DR1 and DR2 for purposes of illustration of an implementation which would include the full array, e.g 512 driver circuits DR1–DR512 as indicated in FIG. 1B.

In FIG. 4, the difference of the wordline drivers DR1 and DR2 from those shown in FIG. 2 is that the sources of the pull-down NFET transistor N1 and killer NFET transistor N2 in wordline driver DR1 and the sources of pull-down NFET transistor N3 and killer NFET transistor N4 in wordline driver DR2 are connected via node B6 to Word Line Power down (WLPDN) line 32 instead of being connected to ground reference potential).

Figure 5:
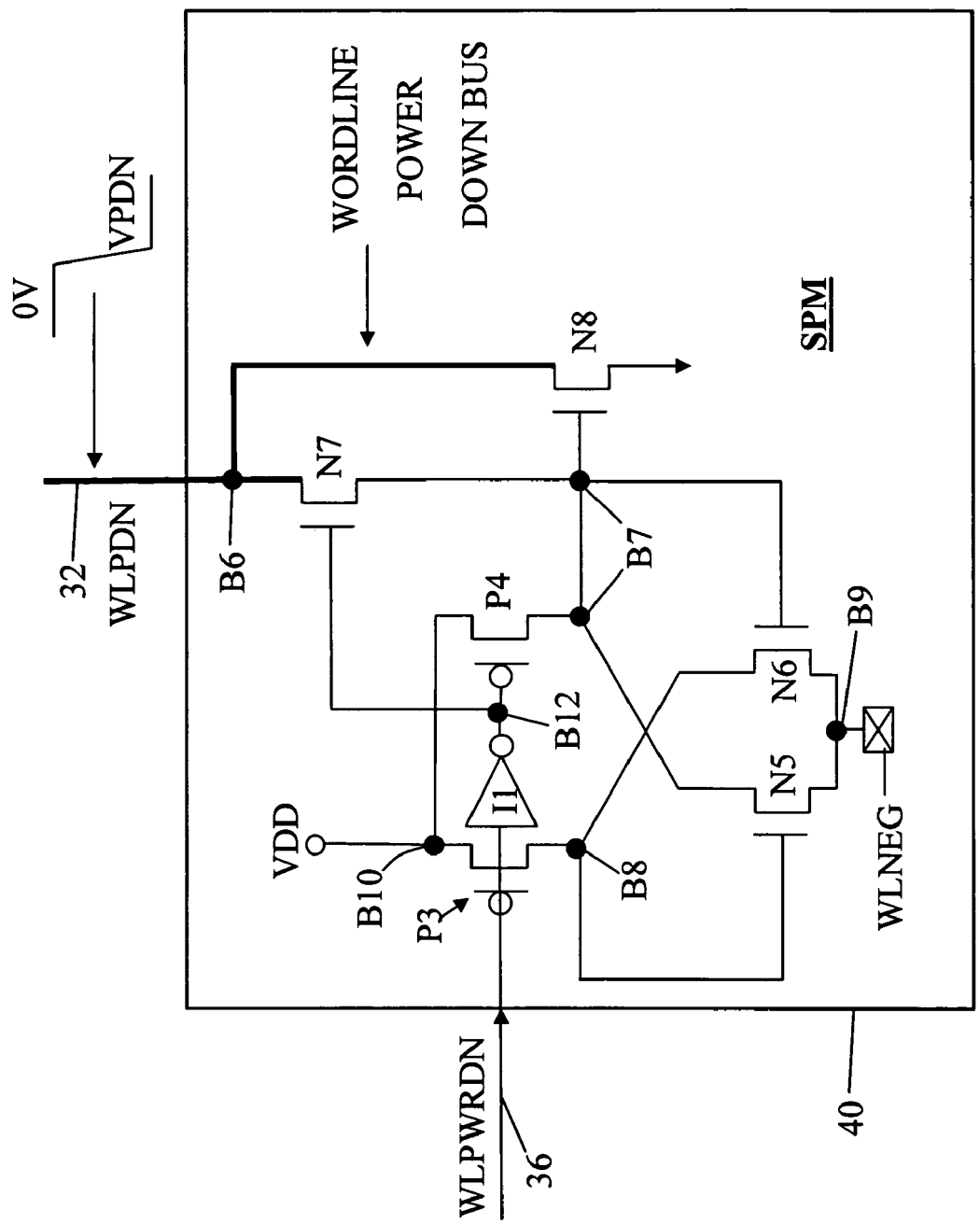
FIG. 5 illustrates an embodiment of the SPM power management block in accordance with this invention comprising a circuit incorporating MOSFET devices including pull-up PFET transistors, pull-down NFET transistors, a pass-through NFET transistor and an inverter.
Figure 6:
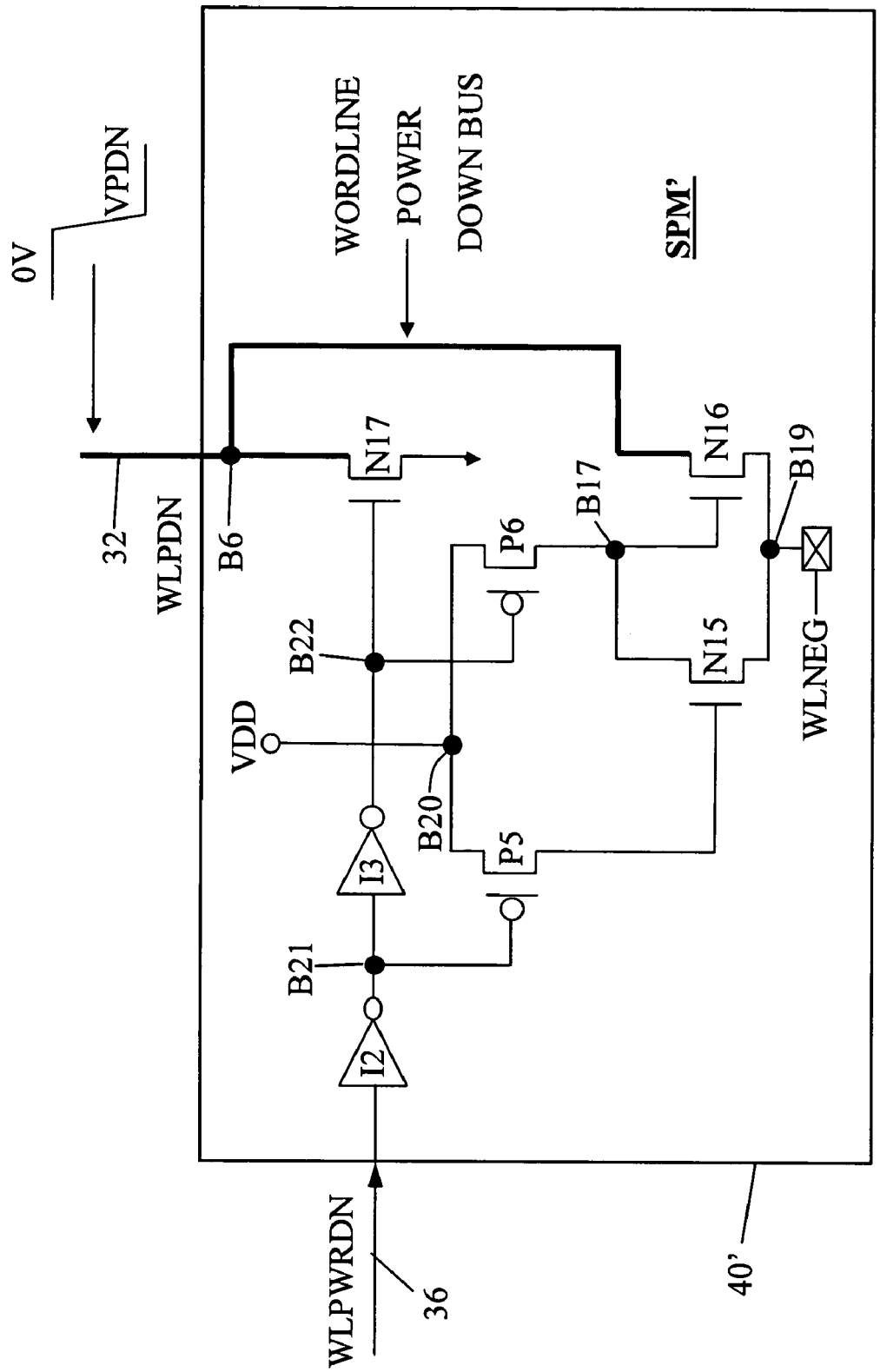
FIG. 6 illustrates a modification of FIG. 5 in which a SPM" power management block comprises a circuit incorporating MOSFET devices including PFET transistors, NFET transistors and two inverters.

FIG. 5 illustrates an embodiment of the SPM power management block 40 comprising a circuit incorporating MOSFET devices including pull-up PFET transistors P3 and P4, pull-down NFET transistors N5, N6, and N8, pass-through NFET transistor N7 and an inverter I1. The WLP-WRDN power down input signal line 36 is connected to the gate of pull-up PFET P3 and the input of inverter I1. The sources of pull-up PFET transistors P3 and P4 are connected via node B10 to positive voltage VDD, e.g. about 1.2V. The drain of pull-up PFET P3 is connected through node B8 to the gate of pull-down NFET N5 and the drain of pull-down NFET N6. The drains of pull-up PFET P4 and pull-down NFET N5 as well as the source of pass-through NFET N7 and the gate of NFET N6 are connected via node B7 to the gate of pull-down NFET N8. The sources of pull-down NFET transistors N5 and N6 are connected through node B09 to WordLine NEGative voltage WLNEG, e.g. from about. 0.2 to about 1.0V. The drain of pass-through NFET N7 and the source of pull-down NFET N8 are connected via node B6 to the WordLine Power DowN Bus (WLPDN) line 32.

Referring to FIG. 5, the operation of the SPM block 40 is as follows. During operation in the high performance mode, the input to the circuit 40, the control signal on WLPWRDN power down input signal line 36, is high or logic level "1". Pull-up PFET transistor P3 will be off. The input to inverter I1, which is also connected to the WLPWRDN line 36 has its output connected to node B12, which will be at logic level "0". The gates of pull-up PFET transistor P4 and of pass-through NFET transistor N7 are both connected to node B12, so they are at the output potential from the inverter I1, i.e. logic level "0. Thus the output of inverter I1 which is at logic level "0" produces a low potential on node B12 which prevents pass-through NFET N7 from conducting. This same low potential on node B12 at the gate of pull-up PFET P4 will enable conduction thereof and the drain terminal of pull-up PFET P4 that is connected to node B7 will be charged to a logic level "1". The gate of pull-down NFET N8 is also connected to node B7, so the potential (logic level "1") at the gate of NFET N8 will turn-on transistor N8 discharging the WordLine Power DowN WLPDN output line 32 of the SPM block 40 to ground, which was the condition in the circuit of FIG. 2. The same potential will also enable conduction of pull-down NFET N6. Conduction will pull the drain of pull-down NFET N6 and the gate of pull-down NFET N5 to the voltage WLNEG. This will ensure that pull-down NFET transistor N5 does not conduct.

During standby mode, the input signal to the SPM block 40 on the WLPWRDN control signal line 36, is low or logic level "0". The Pull-up PFET transistor P3 will conduct and charge its drain to logic level "1", the output of inverter Ii will also be logic level "1". This potential at the gate of pass-through NFET N7 will allow it to conduct and pull its drain voltage to the same potential as its source terminal that is connected to node B7. The source potential on pass-through through NFET N7 is set in the following manner. The logic level "1" on node B12 at the gate of pull-up PFET transistor P4 will disable conduction thereof into node B7. With the drain of P3 at a logic level "1" node B8 will be at the potential of node B10, so pull-down NFET transistor N5 will conduct and discharge its drain terminal that is connected to node B7 to the voltage WLNEG on node B9. Node B7 is also the source terminal of pass-through NFET transistor N7. Therefore, the WLPDN bus line 32, which is connected to node B6 will be discharged to the voltage WLNEG. This lower voltage on node B6, unlike the ground potential of FIG. 2 will bias the row driver circuits DR1, DR2 (up to DR512) and array transistor circuits A0/A1, etc. to a reduced standby current state. When the voltage WLNEG is connected to the node B6, all of the sources of the NFETs in the driver circuits DR1–DR512 are lowered to near the voltage WLNEG, which, when the respective NFETs are conducting, lowers the voltage on nodes B2 and B4 in FIG. 4 to near voltage WLNEG, turning off the word-lines 26-1 and 26-2, etc. and placing a negative bias on the gates of the array transistor circuits A0/A1, etc. which causes the bias of the gate-drain terminals of the memory pass transistor to become reverse biased. This will greatly reduce the leakage current in the capacitive memory elements in which high data or logic level "1" is stored. Since all of the wordlines and consequently all gate-drain terminals of the memory pass transistors will be biased to the standby potential, the total standby current of the memory chip will be reduced by several orders of magnitude.

Basically the system of SPM" 40" is analogous to the operation of the SPM 40 in FIG. 5. The conduction of NFET 16 when the node B17 is high causes the node B6 to be lowered to the WLNEG potential. The operation of the SPM block 40" is as follows. During high performance mode, the input to the circuit, WLPWRDN on line 36, is high or logic level "1". The output of inverter I2 having its input connected to WLPWRDN line 36 and its output connected to node B21 will be logic level "0". The output of inverter I3 having its input connected to the output B21 of inverter I2 and its output connected to node B22 will be logic level "1". The gate of pull-up PFET transistor P5 is connected to node B21. The logic level "0" or low potential on node B21 allows pull-up PFET transistor P5 to conduct and charge its drain terminal to VDD. The drain terminal of PFET P5 is connected to the gate terminal of pull-down transistor N15. The high potential at its gate terminal will cause pull-down transistor N15 to conduct and discharge node B17 to the WLNEG potential. Node B17 is also connected to the gate terminal of pull-down NFET transistor N16 and the drain of pull-up PFET transistor P6, respectively. The WLNEG potential on node B17 will disable conduction of pull-down NFET transistor N16. Node B22, which is at a logic level "1" is connected to the gate of pull-down NFET transistor N17 and the gate of pull-up PFET transistor P6, respectively. The high potential on node B22 will disable conduction of pull-up PFET transistor P6 and will enable conduction of pull-down NFET transistor N17, respectively. The conduction of pull-down NFET transistor N17 will discharge the WLDPN bus 32 to ground, the logic level "0"for high performance mode.

Basically the system of SPM" 40" is analogous to the operation of the SPM 40 in FIG. 5. The conduction of NFET 16 when the node B17 is high causes the node B6 to be lowered to the voltage WLNEG. The operation of the SPM block 40" is as follows. During operation in the high performance mode, the input to the circuit, WLPWRDN on line 36, is high or logic level "1". The output of the inverter I2 having its input connected to WLPWRDN line 36 and its output connected to node B21 will be logic level "0". The output of the inverter I3 having its input connected to the output B21 of inverter I2 and its output connected to node B22 will be logic level "1". The gate of the pull-up PFET transistor P5 is connected to node B21. The logic level "0" or low potential on node B21 allows pull-up PFET transistor P5 to conduct and charge its drain terminal to VDD. The drain terminal of the PFET P5 is connected to the gate terminal of the pull-down transistor N15. The high potential at its gate terminal will cause the pull-down transistor N15 to conduct and to discharge the node B17 to the voltage WLNEG. Node B17 is also connected to the gate terminal of pull-down NFET transistor N16 and the drain of pull-up PFET transistor P6, respectively. The voltage WLNEG on node B17 will disable conduction of pull-down NFET transistor N16. Node B22, which is at a logic level "1" is connected to the gate of pull-down NFET transistor N17 and the gate of pull-up PFET transistor P6, respectively. The high potential on node B22 will disable conduction of pull-up PFET transistor P6 and will enable conduction of pull-down NFET transistor N17, respectively. The conduction of pull-down NFET transistor N17 will discharge the WLDPN bus 32 to ground, the logic level "0" for high performance mode.

During standby mode, the input to the circuit, WLPWRDN on line 36, is low or at logic level "0". In that case, the output of inverter I2, having its input connected to the WLPWRDN line 36 and its output connected to node B21, will be at logic level "1". The output of the inverter I3, having its input connected to the output of inverter I2 via node B21 and its output connected to the node B22, will be at logic level "0". The gate of pull-up PFET transistor P5 is connected to the node B21. The high potential on the node B21 will prevent the pull-up PFET transistor P5 from conducting. The node B17 is also connected to the gate terminal of the pull-down NFET transistor N16 and the drain of the pull-up PFET transistor P6, respectively. The node B22, which is at a logic level "0", is connected to the gate of the pull-down NFET transistor N17 and the gate of the pull-up PFET transistor P6, respectively. The low potential on the node B22 will enable conduction of the pull-up PFET transistor P6 and will disable conduction of the pull-down NFET transistor N17, respectively. The conduction of the Dull-up PFET transistor P6 will charge the gate terminal of the pull-down NFET transistor N16 to VDD. This will enable the pull-down NFET transistor N16 to conduct and discharge the WLDPN bus 32 to voltage WLNEG, the logic level "0" for operation in the standby mode.

The lower voltage on the node B6, unlike the ground potential of FIG. 2 will bias the row driver circuits DR1, DR2 (up to DR512) and the array transistor circuits A0/A1, etc. to a reduced standby current state. When the WLNEG voltage is connected to the node B6 in FIGS. 5 and 6, all of the sources of the NFETs in the driver circuits DR1–DR512 are lowered to near the voltage WLNEG, which, when the respective NFETs are conducting lowers the voltage on nodes B2 and B4 in FIG.4 to near voltage WLNEG turning off the wordlines 26-1 and 26-2, etc. and placing a negative bias on the gates of the array transistor circuits A0/A1, etc. which causes the bias of the gate-drain terminals of the memory pass transistors to become reverse biased. This will greatly reduce the leakage current in the capacitive memory elements in which high data or logic level "1" is stored. Since all of the wordlines and consequently all gate-drain terminals of the memory pass transistors will be biased to the standby potential, the total standby current of the memory chip will be reduced by several orders of magnitude.

What is claimed is:

1. A memory system including:
a memory array, a wordline driver for said memory array, and a standby power management circuit for connection to drivers circuits in said wordline driver,
said standby power management circuit including an input terminal and an output terminal,
said input terminal being connected through an inverter to the gate of a pull-up transistor,
said output terminal being connected in series with a pass through transistor,
a pull down FET transistor having a source/drain circuit connected in series with a source of negative potential coupled to said output terminal, and
control FET transistors connected to switch the gate of said pull down FET transistor as a function of a power down signal applied to the input.

2. The memory system of claim 1 including
an inverter with an input and an output connected to a first node (B12),
a first pull-up FET transistor (P3) having a gate and having a source/drain circuit connected through a second node (8B) in series with a source/drain circuit of a first pull-down FET transistor (N6) between positive and negative power supply voltages, said first pull-down FET transistor having a gate connected to a third node (B7),
a second pull-up FET transistor (P4) having source/drain circuit connected through said third node (B7) in series with a source/drain circuit of a second pull-down FET transistor (N5) between positive and negative power supply voltages;

a third pull-down FET transistor (N8) with a source/drain circuit connected between said output terminal and ground,
a pass-through transistor (N7) having a source connected to said output terminal, a drain connected to said third node (B7),
said inverter input and said gate of said first pull-up transistor being connected in parallel to said input terminal,
said inverter output being connected through said first node (B12) to said gates of said second pull-up transistor (P4) and said pass-through transistor (N7),
said drain of said first pull-up transistor (P4) being connected through a fourth node (B8) to said gate of said second pull-down transistor (N5), and
said drain of said second pull-up transistor (P4) being connected through said third node (B7) to said drain of said pull-down transistor (N7) and said gates of said third pull-down transistor (N8) and said first pull-down transistor (N6).

3. The memory system of claim 1 including:
a first pull-up FET transistor (P5) having a gate connected to a first node (B21) and a source/drain circuit,
a first pull-down FET (N15) having a drain connected to a second node (B17) and a source connected to a negative power supply voltage,
a second pull-up FET transistor (P6) having a gate connected to a third node (B22) a source/circuit connected to a positive power supply voltage and a drain connected to said second node (B17),
a second pull-down FET (N16) having a gate connected to said second node, a drain connected to said output terminal, and a source connected to a negative power supply voltage,
a pass-through transistor (N17) having a gate connected to said third node (B22) a drain connected to said output terminal and a source connected to ground,
a first inverter with an input connected to said input terminal and an output connected to said first node (B21), and
a second inverter with an input connected to said first node (B21), and an output connected to said third node (B22).

4. A memory system including:
a memory array, a wordline driver for said memory array, and a standby power management circuit for connection to drivers circuits in said wordline driver,
said standby power management circuit including an input terminal and an output terminal,
said output terminal being connected to vary bias to said driver circuits in said wordline driver to vary operation thereof between full power current operation and reduced standby current operation,
said output terminal being connected in series with a pass through transistor,
a pull-down FET transistor having a source/drain circuit connected in series with a source of negative potential coupled to said output terminal, and
control FET transistors connected to switch the gate of the pull-down FET transistor as a function of a power down signal applied to said input terminal.

5. A memory system including:
a memory array, a wordline driver for said memory array, and a standby power management circuit for connection to drivers circuits in said wordline driver,
said standby power management circuit including an input terminal and an output terminal, said input terminal being connected through an inverter to the gate of a pull-up transistor, said output terminal being connected in series with a pass through transistor, a pull down FET transistor having a source/drain circuit connected in series with a source of negative potential coupled to said output terminal, control FET transistors connected to switch the gate of said pull down FET transistor as a function of a power down signal applied to said input terminal, and said output terminal is connected to control the bias row driver circuits to a reduced standby current.

6. A memory system including:

a memory array, a plurality of wordline drivers included in a group of wordline drivers with n wordline drivers in a group, a row address decoder block which has an output connected to each of said wordline drivers in said group of wordline drivers, a row selector block which has a selector line connected to $n/2^x$ of said wordline drivers in said group of n wordline drivers, where x=is an integer greater than 1, a power management circuit having a power down input for a power down input signal (WLPWRDN), and a wordline power down output (WLPDN) connected to said wordline drivers to lower power consumption thereof as a function of said power down input signal.

7. The memory system of claim 6, wherein:

said power management circuit includes a plurality of FET devices, an inverter and a negative bias voltage, one of said FET devices connecting a reference potential to the WLPDN output in the absence of a WLPWRDN signal, and another FET connecting a negative voltage WLNEG to the WLPDN output in the presence of a WLPWRDN signal.

8. The memory system of claim 7, wherein:

said power management circuit includes a plurality of FET devices, an inverter and a negative bias voltage, one of the FET devices connecting a reference potential to the WLPDN output in the absence of a WLPWRDN signal and another FET connecting a negative voltage WLNEG to said WLPDN output in the presence of a WLPWRDN signal.

9. The memory system of claim 6 wherein said standby power management circuit includes an input terminal and an output terminal, and said output terminal is connected to vary bias to said driver circuits in said wordline driver to vary operation thereof between full power current operation and reduced standby current operation.

* * * * *